(12) United States Patent

Shida (10) Patent No.: US 6,191,455 B1
(45) Date of Patent: Feb. 20, 2001

(54) SEMI-CONDUCTOR DEVICE PROTECTED BY ELECTROSTATIC PROTECTION DEVICE FROM ELECTROSTATIC DISCHARGE DAMAGE

(75) Inventor: Akira Shida, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/038,966

(22) Filed: Mar. 12, 1998

(30) Foreign Application Priority Data

Mar. 12, 1997 (JP) .................................................. 9-057728

(51) Int. Cl.[7] .................................................. H01L 23/62
(52) U.S. Cl. .......................... 257/362; 257/355; 257/356; 257/361
(58) Field of Search .................................. 257/355, 356, 257/357, 361, 362, 367

(56) References Cited

U.S. PATENT DOCUMENTS 4,862,233 * 8/1989 Matsushita et al. .................. 257/328
5,357,126 * 10/1994 Jimenez ................................. 257/173
5,874,763 * 2/1999 Ham ...................................... 257/360

FOREIGN PATENT DOCUMENTS 57-35374 2/1982 (JP) .
1-185972 7/1989 (JP) .
349257 3/1991 (JP) .

OTHER PUBLICATIONS

*VLSI Electronics Microstructure Science*, vol. 22, Chap. 3, pp. 27–37.
Y. Fong et al., "Internal ESD Transients in Input Protection Circuits", 1989 *IEEE/IRPS*, pp. 77–81.

* cited by examiner

*Primary Examiner*—Mahshid Saadat
*Assistant Examiner*—George C. Eckert, II
(74) *Attorney, Agent, or Firm*—Sughrue, Mion, Zinn, Macpeak & Seas, PLLC

(57) ABSTRACT

A semiconductor device has electrostatic protection device capable of preventing characteristic fluctuation of MOS transistor caused by electrostatic discharge. PN junction is formed in between N[+] cathode region and boron upward diffusion region of P[+] substrate, thus being formed low breakdown voltage diode whose breakdown occurs at low reverse voltage. The diode is in use as electrostatic protection device of either input circuit or output circuit so that it is capable of protecting internal device transistor efficiently from applied surge when gate oxide film becomes thin film.

5 Claims, 7 Drawing Sheets

OUTPUT TRANSISTOR

SEMI-CONDUCTOR DEVICE PROTECTED BY ELECTROSTATIC PROTECTION DEVICE FROM ELECTROSTATIC DISCHARGE DAMAGE

BACKGROUND OF THE INVENTION

The present invention relates to a semi-conductor device. More to particularly this invention relates to a semi-conductor device having an electrostatic protection device for protecting from electrostatic discharge damage as to silicon large scale integrated circuit (LSI) at which an epitaxial substrate is in use.

DESCRIPTION OF THE PRIOR ART

In the semiconductor device, a rated value thereof exists. The semiconductor device should not be used while exceeding the defined rated value. When the semiconductor device is used while exceeding the rated voltage, characteristic of the semiconductor device is changed or the semiconductor device itself is broken. However, in some cases, a surge which is sudden electric pulse exceeding the rated voltage is applied to the semi-conductor device.

Under the circumstances, various protection methods are proposed for protecting the semi-conductor device from the surge. "VLSI ELECTRONICS MICROSTRUCTURE SCIENCE Vol. 22" by Anant. G. Sabnis discloses prior technology for protecting the semi-conductor device from the surge. There is explained the protection technology from the surge referring to this document.

Figure 1A:
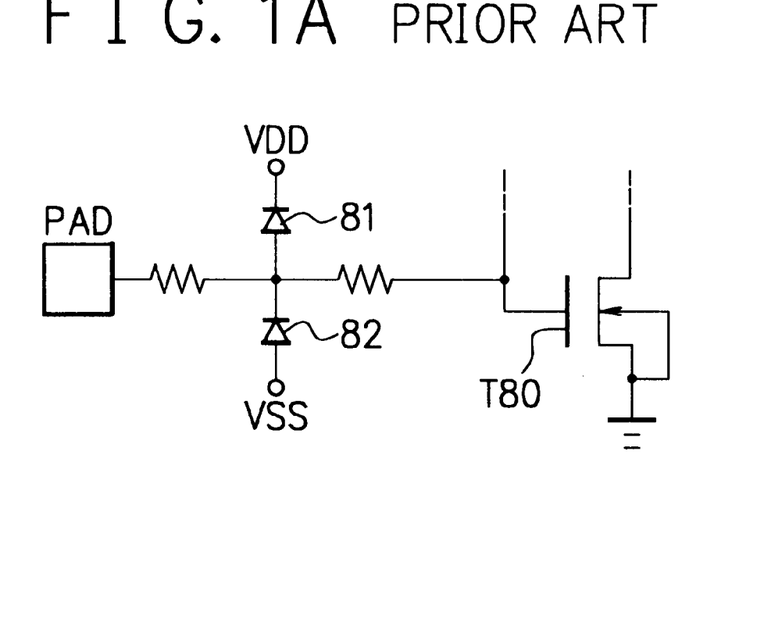
FIGS. 1A, 1B are circuit views showing conventional input protection circuit.

According to the prior technology, an internal transistor of LSI is protected by an electrostatic protection device from the surge applied to an outer terminal. As shown in FIG. 1A, in a metal-oxide semiconductor large scale integrated circuit (MOS LSI), it causes a protection device to be provided at an input terminal in order to prevent fluctuation of transistor characteristic caused by application of surge to gate oxide film of an internal circuit directly, or breakdown of the gate oxide film. Namely, diodes 81, 82 are connected in between the outer terminal and VDD, and in between the outer terminal and ground (GND) respectively. It causes charge generated by application of the surge to discharge through these diodes. Thereby these diodes function as devices which causes stress to the gate oxide film of the internal transistor to ease. On the other hand, with respect to an output terminal, a drain junction of an output transistor T80 accomplishes a role of protection device.

Figure 1B:
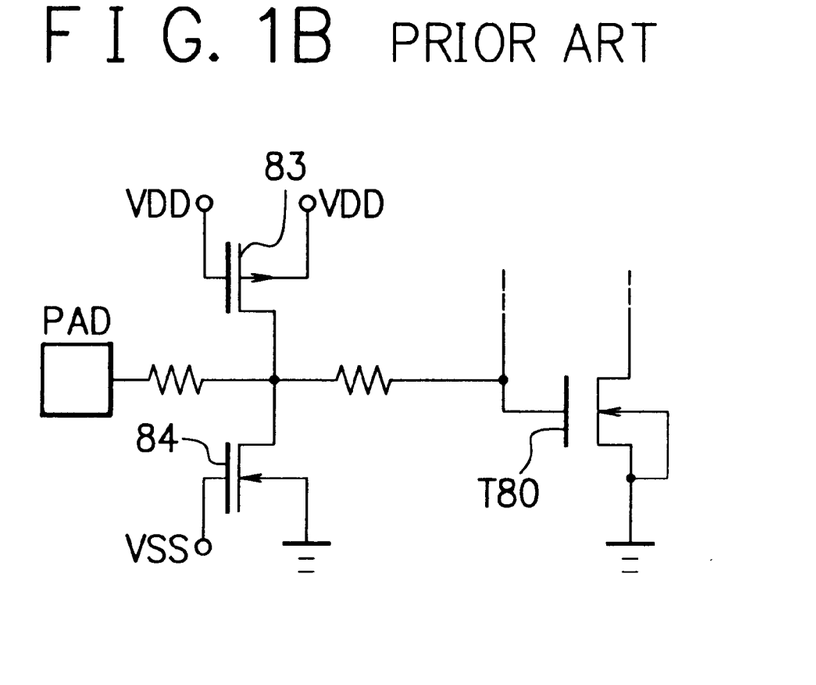

Further, as shown in FIG. 1B, in logic LSI which is typical of gate array, gate control type diodes 83, 84 whose protective effect is higher than the diode are used as a protection device of the input terminal. The gate control type diodes 83, 84 utilize a MOS transistor. The control gate terminal of the NMOS type transistor 84 is connected to the GND, while the control gate terminal of the PMOS type transistor 83 is connected to the VDD. Forward characteristic thereof is identical with above-described diode, while reverse characteristic is that it causes breakdown to be done at lower voltage (BVds) than that of the above-described diode. Thereby the protective effect to the surge is enhanced. Furthermore, in the NMOS type transistor whose source terminal is connected to the GND to form MOS constitution so that the protection device becomes ON-state at further low voltage while utilizing snap back phenomena, thereby it causes protective effect to the surge to further enhanced.

On the other hand, it is necessary to cause gate oxide film to be thin film for operating LSI in more high speed, or for enhancing integration degree of LSI. However, surge resistance property of the gate oxide film becomes weak with reduction of thickness of gate oxide film. Above-described protection devices 83, and 84 are of MOS construction, thus there are problems that leak current increases and breakdown occurs easily while applying surge to gate oxide film of the protection device. Furthermore, an output transistor T80 combined with role of protection device, although breakdown does not occur, there is a problem that circuit operation is influenced by fluctuation of characteristic caused by charge injection into gate oxide film.

Figure 2A:
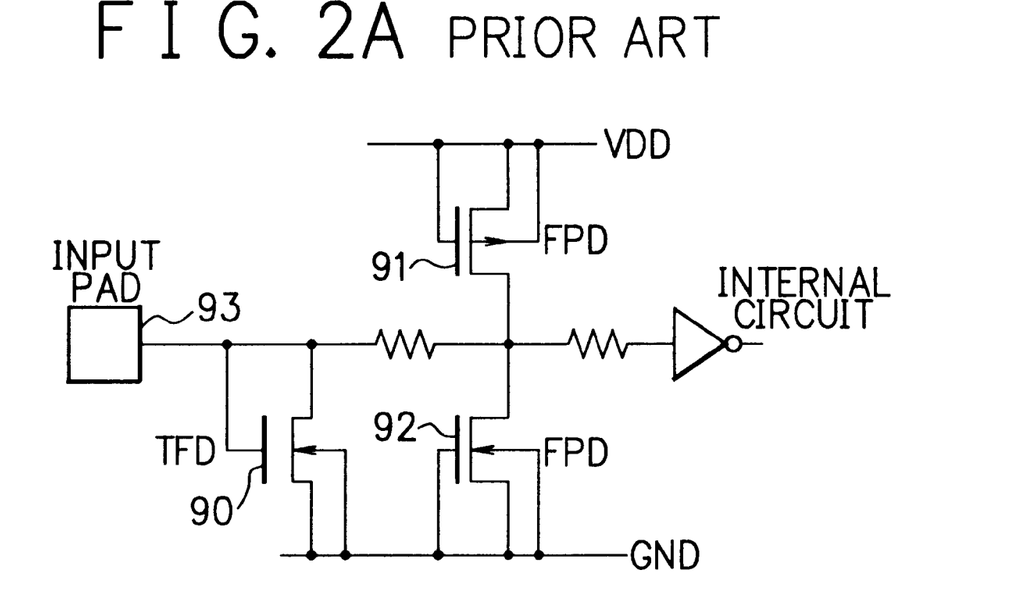
FIGS. 2A, 2B are circuit views showing conventional input/output protection circuit using field transistor.

As the method for resolving the above-described problems, "Internal ESD Transients in Input Protection Circuits IEEE/IRPS 1989" by Y. Fong and C. Hu discloses construction in which field transistor is added to conventional protection device. As shown in FIG. 2A, field transistor (Thick Field Device, TFD) 90 is inserted in between the above-described conventional protection devices (Field Plate Diode, FPD) 91, 92 and input pad 93. While in relation to output transistor, as shown in FIG. 2B, field transistor (TFD) 95 is inserted in between two output transistors of PMOS type transistor 96 and NMOS type transistor 97, and output pad 98.

Figure 3:
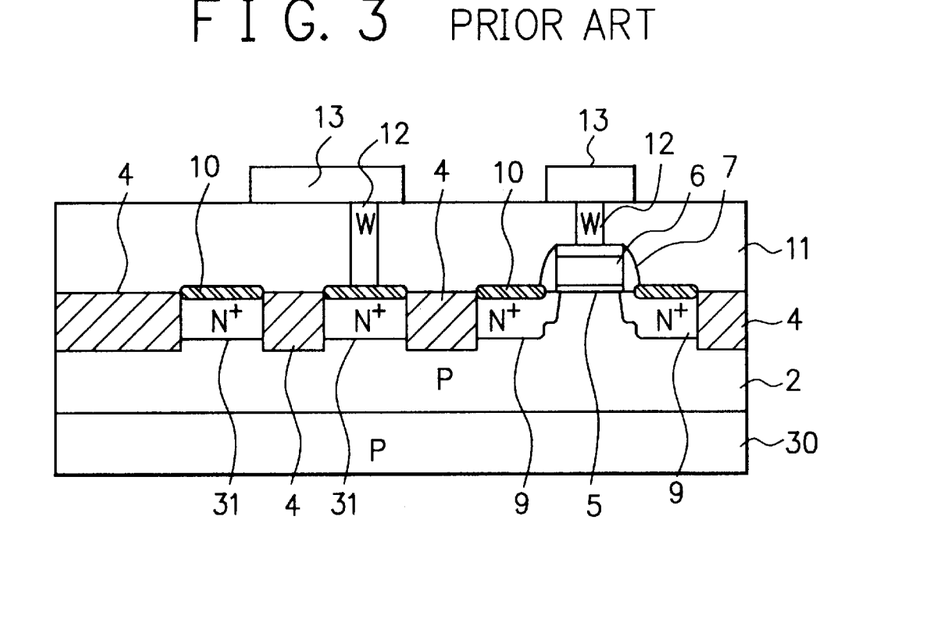
FIG. 3 is a cross sectional view showing construction of conventional field transistor.

Next, FIG. 3 is a cross sectional view showing construction of the conventional field transistor. The transistor is a parasitic bipolar transistor with adjoined N$^+$ diffusion layer region 31 separated by device isolation oxide film 4 as an emitter and a collector respectively, and with P-well 2 as a base. A controlling electrode enveloping the device isolation oxide film 4 is connected to the collector. The N$^+$ diffusion layer region 31 and source region and drain region of the NMOS transistor are formed simultaneously, and NMOS transistor is formed on the P-well 2. Metal silicide 10 for lowering resistance is formed on the surface of the N$^+$ diffusion layer region 31 and on the surface of the gate electrode 6 of the NMOS transistor. Here, reference numeral 5 denotes gate oxide film, 6 denotes gate electrode, 7 denotes side wall oxide film, 9 denotes N$^+$ SD region, 11 denotes substrate interlayer insulation film, 12 denotes embedded electrode, 13 denotes wiring electrode, and 30 P-type substrate.

Figure 2B:
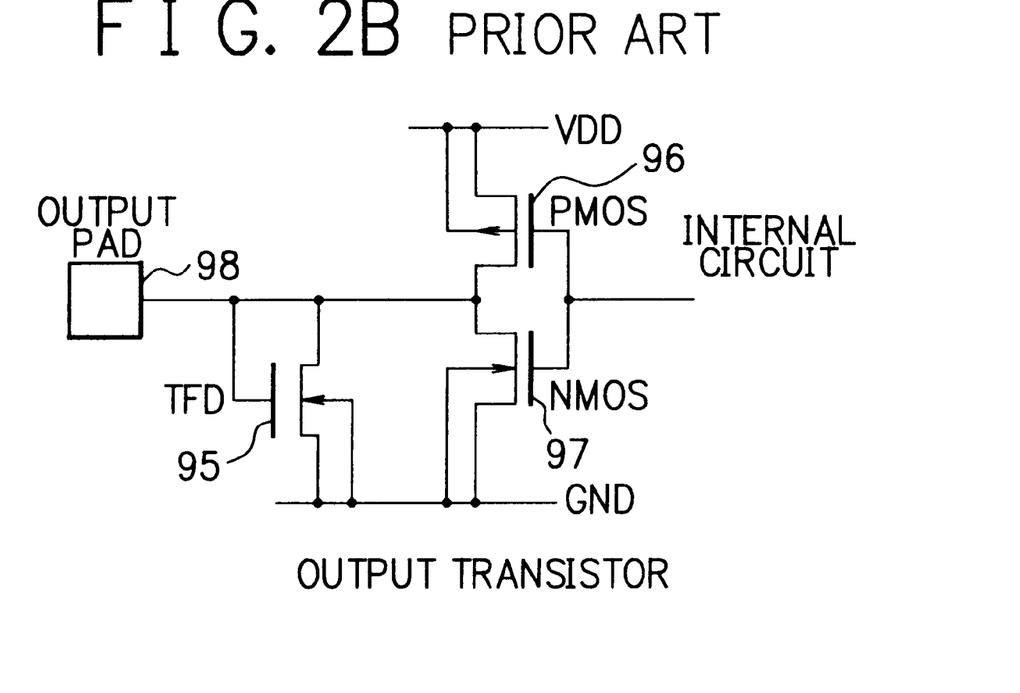

Next, protection effect in relation to surge of the conventional semiconductor device is explained referring to FIGS. 2A, 2B, and 3. When, for example, positive surge voltage is applied to the input pad 93 or the output pad 98, shown in FIG. 2. Protection device or output transistors 96, 97 in next part are protected by escaping surge while causing the parasitic bipolar transistor to be ON-state in between collector-emitter. While in relation to negative voltage application, it is capable of escaping charge to the P-well 2 in regard to value of bias more than Vf, because diode in between collector and P-well comes into forward bias.

As described above, in the electrostatic protection device using the conventional field transistor, it is capable of protecting gate oxide film of the internal circuit or the gate control type diode by causing the field transistor to be ON.

However, protection effect of the semiconductor device is still insufficient. Enlargement of the effect thereof is required. In the conventional semiconductor device, in order to enlarge the protection effect there is a method that it causes charge accompanied with surge to flow easily while increasing area of the field transistor. There is a method that the semi-conductor device has a device construction in which transistor is easy to come into ON-state. However, with regard to the first method which opposes direction of making LSI smaller. There are problems that large influence to circuit characteristic with enlargement of parasitic capacitance occurs, thus reducing operation margin. With regard to the second method, it becomes necessary to enhance injection efficiency of carrier from emitter to base while lowering density of the P-well 2.

However, in order to render LSI microscopic, it becomes necessary to enhance density of well as represented by scaling law. Further, enhancement of density for the well is a technology which is necessary to realize microscopic device isolation. Consequently, to enhance injection efficiency of carrier from emitter to base while lowering density of P-well is contrary to microscopic LSI. Although it is capable of lowering effective impurity density of only P-well of the field transistor forming section by implementing ion implantation of N-type impurity to the P-well while adding PR (photo resist) process in manufacturing process of the field transistor, in this method, there is a problem that manufacturing dispersion of density control is very large caused by reaction of ion implantation.

Furthermore, in front and behind of manufacturing process of 0.25 μm, shallow trench isolation technology (STI) is used for realizing microscopic device isolation. In device isolation construction due to shallow trench, however, there is a problem that the field transistor becomes hard to come into ON, because isolation oxide film is thick, and shape of side wall becomes nearly vertical.

Consequently, it becomes hard to enhance protection effect in an electrostatic protection device using the conventional field transistor accompanying with the fact that LSI is operated in higher speed, and LSI further comes into microscopic. On the other hand, as the gate oxide film of the MOS transistor becomes thin film, resisting characteristic of the gate oxide film in relation to electric charge injection becomes weak. Consequently, there comes up against the problem that reliability of the gate oxide film is easy to lower due to ESD (Electrostatic Discharge) damage.

SUMMARY OF THE INVENTION

In view of the foregoing, it is an object of the present invention to provide a semi-conductor device which has high reliability, and which is capable of contributing to higher integration of LSI while reducing size of I/O buffer, and which has electrostatic protection device with construction of high protection effect in relation to electrostatic discharge.

In accordance with one aspect of the present invention, for achieving the above-mentioned object, there is provided a semiconductor device in which a MOS transistor is formed on a first conductive type semiconductor layer being subjected to epitaxial growth on the first conductive type high density semiconductor substrate, the semiconductor device comprises an electrostatic protection device of the MOS transistor, the electrostatic protection device being a diode which is connected in between either a gate electrode of the MOS transistor or a drain region and the high density semiconductor substrate, and an impurity density of anode side at junction thereof is higher than an impurity density of anode side at a drain junction of the MOS transistor.

Preferably, there is provided a semiconductor device, wherein reverse breakdown voltage of a diode which is the electrostatic protection device is lower than drain junction breakdown voltage of the MOS transistor.

Preferably, there is provided a semiconductor device, wherein reverse breakdown voltage of a diode which is said electrostatic protection device is lower than breakdown voltage of gate oxide film of the MOS transistor.

Preferably, there is provided a semiconductor device, wherein there exists junction of a diode which is the electrostatic protection device close by the high density semiconductor substrate rather than the drain junction of the MOS transistor.

As stated above, in the semiconductor device according to the aspect of the present invention, when the positive surge voltage is applied from the outer terminal, it is capable of escaping charge to substrate with low resistance value through diode by flowing breakdown current in relation to voltage more than junction breakdown voltage of diode, while when the negative surge voltage applied therefrom, it is capable of escaping charge to substrate by flowing forward current in relation to voltage more than Vf, because diode is subjected to forward bias.

Thus, it causes charge to escape to substrate with low resistance through diode efficiently in relation to applied surge applied from out side thereby, it is prevented breakdown of the gate oxide film while charge being applied to the MOS transistor, and it is prevented occurrence of characteristic fluctuation.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENTS

A preferred embodiment of a semiconductor device according to the invention will now be described in detail referring to the accompanying drawings.

Figure 4:
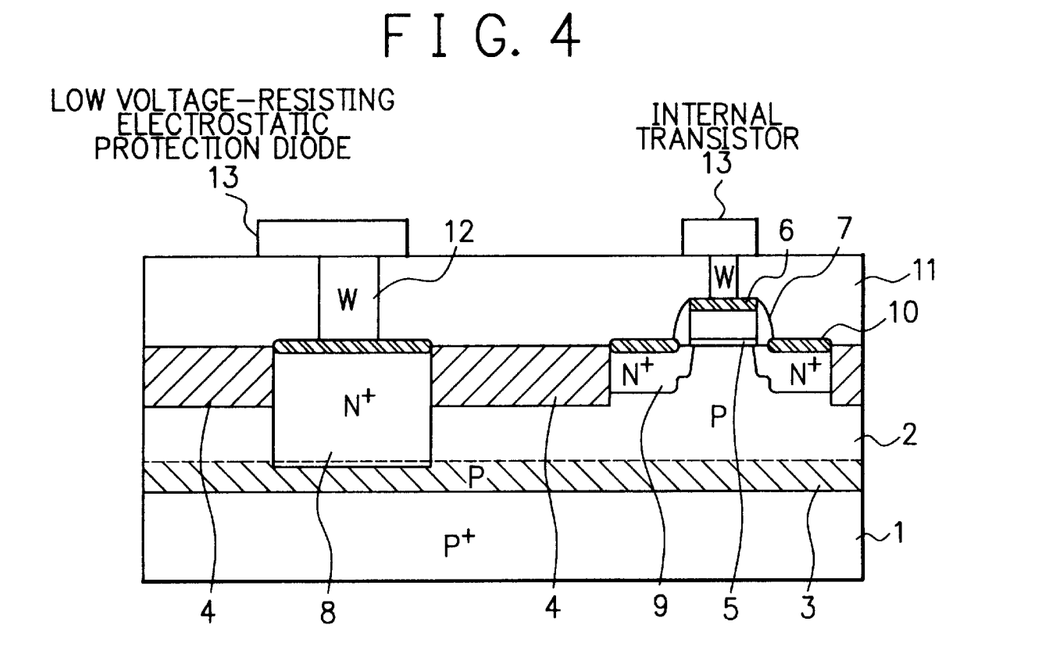
FIG. 4 is a cross sectional view showing construction of a first embodiment of a semiconductor device according to the present invention.

FIG. 4 is a cross sectional view showing a first embodiment of a semiconductor device having low breakdown voltage electrostatic protection diode D and an internal transistor T. The same numerals as those used in the conventional semiconductor device shown in FIG. 3 are appended to the same devices of the semiconductor device according to the present invention. P-well 2 is provided on $P^+$ type substrate 1 through boron upward diffusion region 3 in this semiconductor device. A low breakdown voltage electrostatic protection diode D is formed in between $N^+$ cathode region 8 and the boron upward diffusion region 3. An internal transistor T (as NMOS transistor in the drawing) is formed on the P-well 2. Metal silicide 10 is formed on the surface of $N^+$ cathode region 8, $N^+$ SD region 9 and on the surface of a gate electrode 6 for obtaining low resistivities. In the below-described embodiment, Co-silicide is used as metal silicide. The metal silicide is used for obtaining low resistivity therefore, it is proper to use appropriate metal silicide without limiting to the Co-silicide. Junction breakdown voltage of the low breakdown voltage electrostatic protection diode D is higher than power-supply voltage, and lower than gate breakdown voltage of the internal transistor T.

Figure 5A:
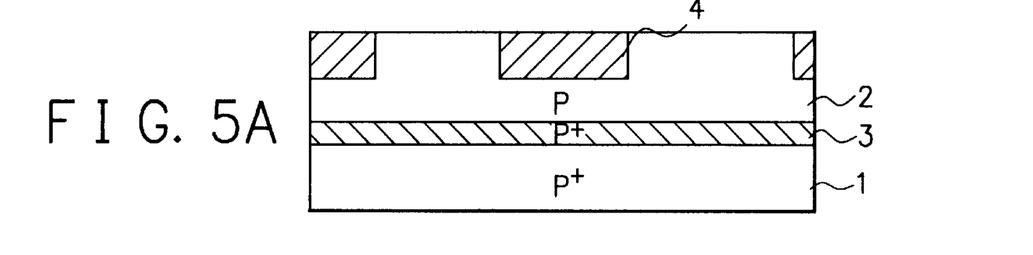
FIGS. 5A, 5B, 5C, and 5D are cross sectional views showing manufacturing process of a semiconductor device of FIG. 4.
Figure 5B:
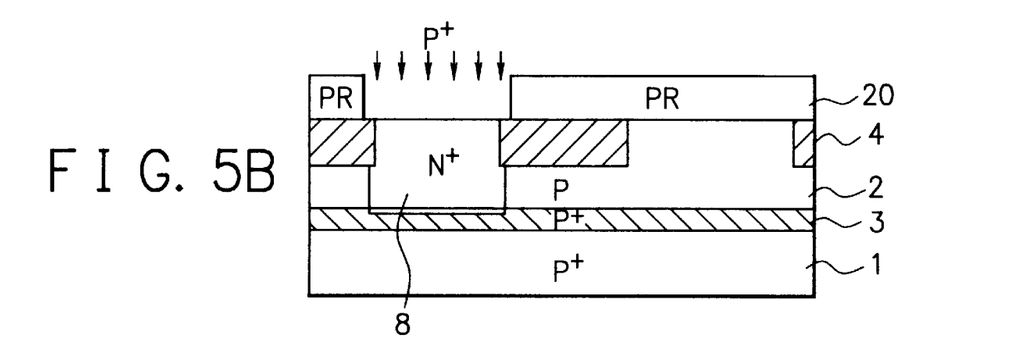
Figure 5C:
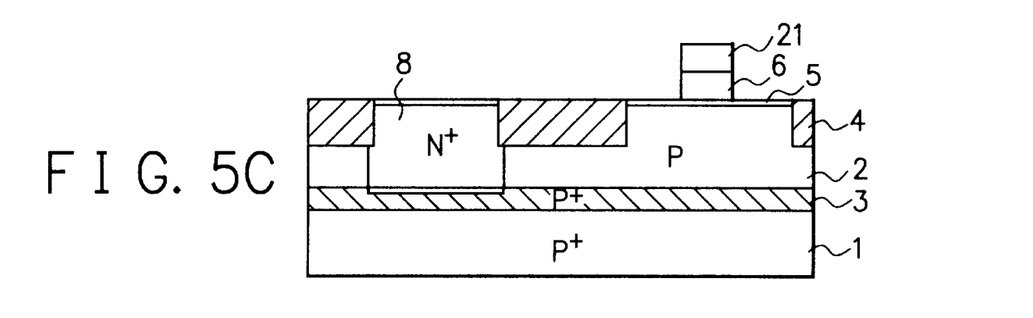
Figure 5D:
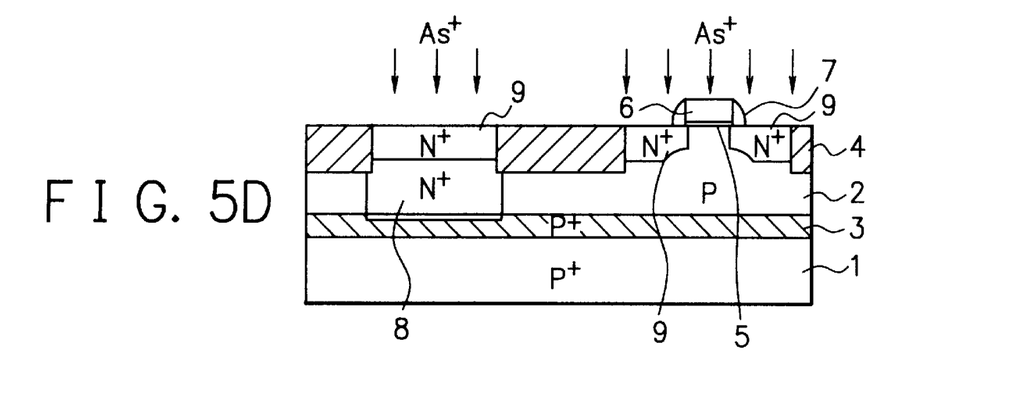

FIGS. 5A–5D are cross sectional views showing manufacturing process of the semiconductor device shown in FIG. 4. There is provided the P-well 2 on the $P^+$ type substrate 1 through boron upward diffusion region 3. Concretely, there is formed the P-well 2 on $P^-/P^+$ substrate. Then there is formed an device isolation oxide film 4 selectively (FIG. 5A). Next, there is formed $N^+$ cathode region 8 by implementing ion implantation of N-type impurity ion with photo resist (PR) 20 as a mask (FIG. 5B). Next, there is implemented pattern generation of gate electrode 6 of the internal transistor by etching with mask material 21 as mask after forming of gate oxide film 5 (FIG. 5C). Subsequently, by virtue of well known technology, there is formed source-drain region of transistor of LDD structure while utilizing side wall oxide film 7. At this time, the ion implantation for forming the $N^+$ SD region 9 is also implemented on the $N^+$ cathode region (FIG. 5D). Subsequently, by virtue of the well known technology, there is formed the metal silicide 10 on the surface of silicon, there is formed substrate interlayer insulation film 11 shown in FIG. 4, there is opened contact region, there is formed embedded electrode 12, there is formed wiring electrode 13, and there is implemented pattern generation, with the result that the structure of the semiconductor device shown in FIG. 4 is perfected.

Figure 6:
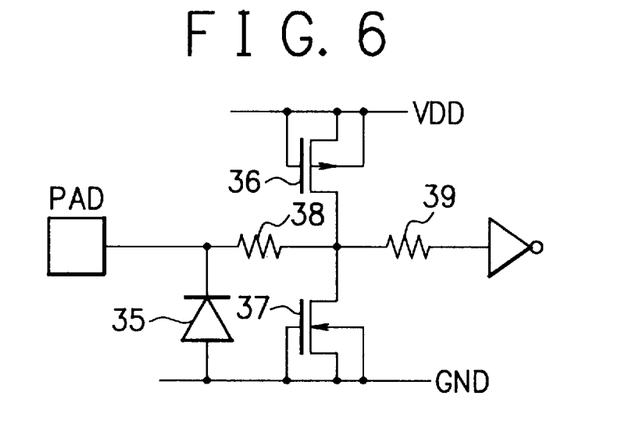
FIG. 6 is a circuit view showing one embodiment in which it causes the semiconductor device according to the present invention to apply to an input circuit.
Figure 7:
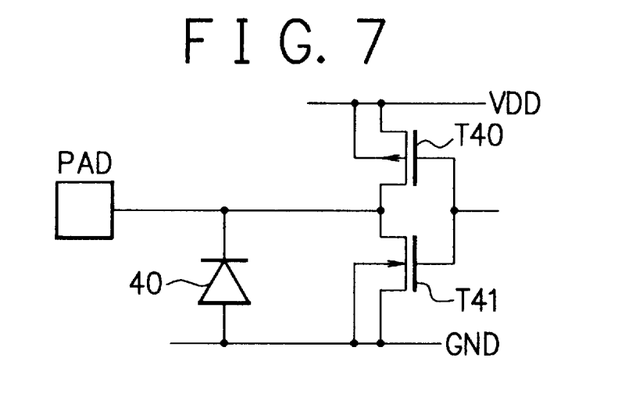
FIG. 7 is a circuit view showing one embodiment in which it causes the semiconductor device according to the present invention to apply to an output circuit.

FIGS. 6 and 7 are views showing one embodiment of I/O circuit using the semiconductor device shown in FIG. 4.

FIG. 6 is a circuit view showing input protection circuit, thus a low breakdown voltage electrostatic protection diode 35 and gate control type diodes 36 and 37 are connected between an input terminal and an internal circuit. In the low breakdown voltage electrostatic protection diode 35, cathode thereof is connected to the input terminal and anode thereof is connected to the GND. Further, the cathode of the low breakdown voltage electrostatic protection diode 35 is connected to the N-type gate control type diode 37 and the P-type gate control type diode 36. These two gate control type diodes 36 and 37 are protection devices which are used in the prior art. These P and N types gate control type diodes 36 and 37 are connected to the internal circuit through further resistor 39.

FIG. 7 is a circuit view showing an output protection circuit. There is provided a low breakdown voltage electrostatic protection diode 40 in between an output transistors T40 and T41, and an output terminal. Drain of the output transistors T40 and T41 is connected to the cathode of the diode 40 and anode of the diode 40 is connected to the GND.

Figure 8:
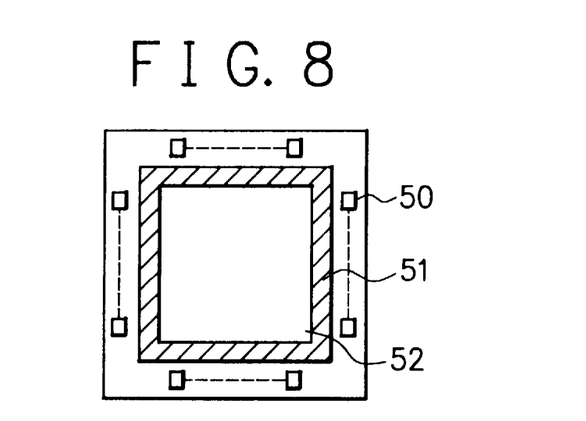
FIG. 8 is a view showing one embodiment of layout on the inside of LSI of the semiconductor device according to the present invention.

FIG. 8 shows an allocation example of low breakdown voltage electrostatic protection devices on the inside of chip of LSI. There is provided a low breakdown voltage electrostatic protection diode forming region 51 near by inside of I/O terminal (PAD) 50, there is formed the low breakdown voltage electrostatic protection diodes of all I/O buffers in the region. An inside area which is surrounded by the low breakdown voltage electrostatic protection diode forming region 51 comes to be internal area 52. In the case of input buffer, a gate control type diode and the internal circuit shown in FIG. 6 are allocated in the internal area 52, while in the case of output buffer, the internal circuit including output transistor shown in FIG. 7 is allocated in the internal area 52.

Furthermore, protective operation to the surge of the semiconductor device according to the first embodiment will be explained in more detail referring to FIGS. 6 and 7. In the input protection circuit shown in FIG. 6, when the surge is applied to the input terminal, the gate control type diodes 36 and 37 are protected from applied surge by the low breakdown voltage electrostatic protection diode 35. Further, the internal circuit is protected by virtue of the low breakdown voltage electrostatic protection diode 35 and the gate control type diodes 36 and 37. Namely, when positive surge voltage is applied, it is capable of letting charge escape to low resistance $P^+$ type substrate through the low breakdown voltage electrostatic protection diode 35 due to junction breakdown current, in regard to voltage which is more than junction breakdown voltage between cathode and anode.

Since reverse junction breakdown voltage between cathode and anode of the low breakdown voltage electrostatic protection diode 35 is set to the value which is less than breakdown voltage of the gate oxide film, it is capable of reducing charge amount which is injected to the gate oxide film of the gate control type diode 36 and 37 from the side. Based upon this operation, change of electrostatic protection faculty to the internal circuit of the gate control type diodes 36 and 37 and/or breakdown of the gate oxide film are prevented. On the other hand, in relation to negative surge voltage, since the low breakdown voltage electrostatic protection diode 35 is subjected to forward bias, it is capable of letting charge escape to $P^+$ type substrate with voltage of more than Vf.

In the output circuit shown in FIG. 7, output transistors T40 and T41 are protected from surge applied to output terminal by virtue of the low breakdown voltage electrostatic protection diode 40. Operation of the low breakdown voltage electrostatic protection diode 40 is substantially the same as that of the low breakdown voltage electrostatic protection diode 35 shown in above described FIG. 6 and this is not described.

Next, structure of the first embodiment of the semiconductor device according to the present invention will be explained in more detail.

In the semiconductor device shown in FIG. 4, there is provided with P-well 2 in approximately $1 \times 10^{17}$ cm$^{-3}$ to $5 \times 10^{17}$ cm$^{-3}$ of surface boron density on $P^+$ type substrate including boron of $1 \times 10^{19}$ to $1 \times 10^{20}$ cm$^{-3}$, thus existing boron upward diffusion region 3 including boron of $1 \times 10^{18}$ to $1 \times 10^{19}$ in between $P^+$ type substrate 1 and P-well 2. Thickness of the boron upward diffusion region 3 is of degree of 1.5 $\mu$m. Thickness of the P-well 2 is of approximately 1 $\mu$m.

$N^+$ cathode region 8 including N type impurity of $1 \times 10^{18}$ cm$^{-3}$ to $1 \times 10^{20}$ cm$^{-3}$ is provided such that $N^+$ cathode region 8 comes into contact with the boron upward diffusion region 3. Here, impurity density of N$^+$ cathode region 8 at the junction is set to approximately $5\times10^{19}$ cm$^{-3}$. A low breakdown voltage electrostatic protection diode D is formed in between N$^+$ cathode region 8 and the boron upward diffusion region 3 and its reverse breakdown voltage is of approximately 4V. On the other hand, an internal transistor T (NMOS transistor) of LDD structure is formed on the P-well 2. Thickness of the gate oxide film 5 is of approximately 5 nm. There is provided with metal silicide (Co silicide) 10 to intend to obtain low resistivity on the surface of N$^+$ cathode region 8, N$^+$ SD region 9 of MOS transistor, and the gate electrode 6.

Next, the semiconductor device according to the present invention will be explained in more detail referring to cross sectional views of manufacturing process of the semiconductor device shown in FIGS. 5A to 5D. It causes silicon including boron of approximately $1\times10^{15}$ on the P$^+$ substrate 1 including boron of $1\times10^{19}$ cm$^{-3}$ to $1\times10^{20}$ cm$^{-3}$ to grow. At this time, the boron upward diffusion region 3 including boron of approximately $1\times10^{18}$ cm$^{-3}$ to $1\times10^{19}$ cm$^{-3}$ is formed with thickness of approximately 1.5 $\mu$m caused by autodoping and thermal diffusion from the P$^+$ type substrate. Subsequently, there is formed an device isolation oxide film 4 consisting of silicon oxide film with thickness of approximately 400 nm by virtue of well known technology. Then, there is provided with oxide film (not illustrated) with thickness of approximately 20 nm on the surface, before implanting ion of boron to region in which NMOS transistor and low breakdown voltage electrostatic protection diode are formed to be provided with the P-well 2 (FIG. 5A).

Three times the ion implantations are implemented in such a way that a condition of a first ion implantation is that acceleration voltage is 300 KV, and ion dose is $3\times10^{13}$ cm$^{-2}$, a condition of a second ion implantation is that acceleration voltage is 150 KV, and ion dose is $5\times10^{12}$ cm$^{-2}$, and a condition of a third ion implantation is that acceleration voltage is 30 KV, and ion dose is $5\times10^{12}$ cm$^{-2}$. The second ion implantation is implemented for the purpose of device isolation between NMOS transistors and prevention of punch through of the NMOS transistor. The third ion implantation is implemented to obtain required Vt. Subsequently, there is formed N-well region while causing N type impurity to be subjected to ion implantation to region in which PMOS transistor is formed (not illustrated). Then, there is implemented pattern generation of photo resist 20 so that N$^+$ cathode region 8 is formed by implanting phosphorus with photo resist 20 as mask (FIG. 5B).

Three times the phosphorus implantations are implemented in such a way that a condition of a first phosphorus implantation is that acceleration voltage is 1 MV, and phosphorus dose is $5\times10^{14}$ cm$^{-2}$ to $1\times10^{15}$ cm$^{-2}$, a condition of a second phosphorus implantation is that acceleration voltage is 300 KV, and phosphorus dose is $5\times10^{14}$ cm$^{-2}$, and a condition of a third phosphorus implantation is that acceleration voltage is 70 KV, and phosphorus dose is $1\times10^{14}$ cm$^{-2}$. The first phosphorus implantation is implemented to determine junction breakdown voltage of the low breakdown voltage electrostatic protection diode. The second and the third phosphorus implantations are implemented to pull N$^+$ cathode region 8 out to surface of silicon with low resistance. Subsequently, recristallization and redistribution of impurity are implemented by drive-in at 850° C. to 900° C. And then, by virtue of the well known technology, there is formed gate oxide film 5 with 5 nm thick, before there is formed gate electrode consisting of silicon of thickness of approximately 200 nm at whole surface.

A gate electrode 6 of the MOS transistor is worked by etching with mask material being subjected to pattern generation as mask (FIG. 5C). Gate length of the internal transistor is worked to, for example, approximately 0.15 $\mu$m. Subsequently, by virtue of the well known technology, there is formed source-drain region of the transistor with LDD construction while utilizing side wall oxide film 7. For example, an arsenic ion implantation is implemented with the condition that acceleration voltage is 20 KV, and arsenic dose amount is $2\times10^{13}$ cm$^{-2}$ in relation to NMOS transistor, before causing oxide film with approximately 60 nm to grow in all surface to implement etch back. With the result that a side wall oxide film 7 is formed. Subsequently, there is formed N$^+$ SD region 9 while implementing ion implantation of arsenic to the region including NMOS transistor and the low breakdown voltage electrostatic protection diode (FIG. 5D).

The ion implantation of arsenic is implemented in such a way that acceleration voltage is 40 KV, and range of arsenic dose amount is $1\times10^{15}$ cm$^{-2}$ to $5\times10^{15}$ cm$^{-2}$. Subsequently, P$^+$ SD region (not illustrated) of the PMOS transistor is formed by the ion implantation of boron. The ion implantation of boron is implemented in such a way that acceleration voltage is approximately 10 KV, and range of boron dose amount is $1\times10^{15}$ cm$^{-2}$ to $5\times10^{15}$ cm$^{-2}$. Subsequently, by virtue of the well known technology, there is formed metal silicide (Co silicide) 10 with thickness of approximately 20 nm on the surface of silicon, there is formed substrate interlayer insulation film 11 with thickness of approximately 0.8 $\mu$m, boring a hole in contact region, forming embedded electrode 12 (W), forming wiring electrode 13 made up of AlCu, and implementing pattern generation, as a result thereof, the semiconductor device having structure shown in FIG. 4 is perfected.

Consequently, according to the first embodiment, it is capable of letting charge escape to low resistance P$^+$ type substrate 1 through the diode D by flowing breakdown current in relation to a positive voltage which is more than a junction breakdown voltage of the diode. While it is capable of letting charge escape to P$^+$ type substrate 1 by flowing forward current in relation to a voltage which is more than Vf because the diode D is subjected to forward bias in relation to negative surge voltage.

Figure 9:
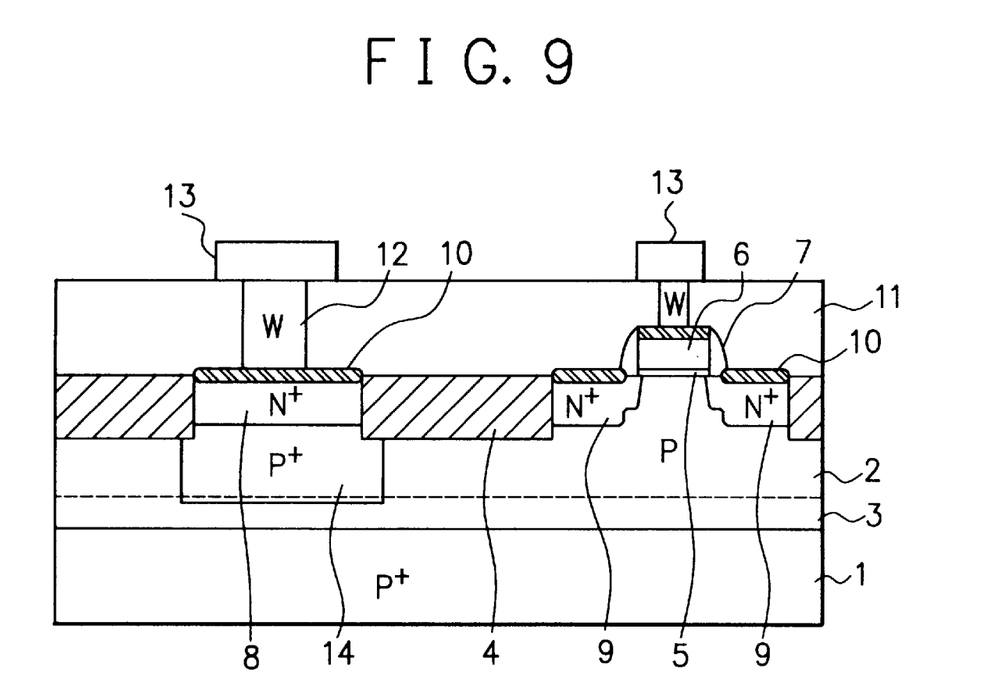
FIG. 9 is a cross sectional views showing construction of a second embodiment of the semiconductor device according to the present invention.

Next, a second embodiment of the semiconductor device according to the present invention will be explained referring the accompanying drawings. FIG. 9 is a cross sectional view showing a second embodiment of a semiconductor device according to the present invention having low breakdown voltage electrostatic protection diode D and the internal transistor T as an electrostatic protection device. The same numeral is appended to the same device as that used in the semiconductor device according to the first embodiment shown in FIG. 4. There is provided with a P-well 2 on P$^+$ type substrate 1 through boron upward diffusion region 3 in the semiconductor device.

Further, there is provided with a P$^+$ anode region 14 on the inside of the P-well 2, there is formed a low breakdown voltage electrostatic protection diode D in between N$^+$ cathode region 8 and P$^+$ anode region 14, and there is formed an internal transistor T (there is formed as NMOS transistor in FIG. 9) on the P-well 2. There is formed a metal silicide 10 for obtaining low resistivity on the surface of N$^+$ cathode region 8, N$^+$ SD region 9, and gate electrode 6. Furthermore, a junction breakdown voltage of the low breakdown voltage electrostatic protection diode D is set to the value which is higher than that of a power-supply voltage of LSI. The junction breakdown voltage of the low breakdown voltage electrostatic protection diode D is set to the value which is lower than that of gate breakdown voltage of the internal transistor T.

Figure 10A:
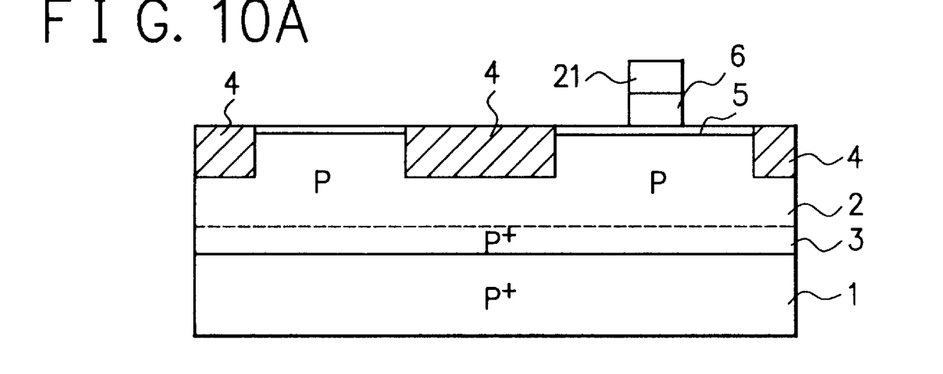
FIGS. 10A, 10B, and 10C are cross sectional views showing manufacturing process of the semiconductor device shown in FIG. 9.
Figure 10B:
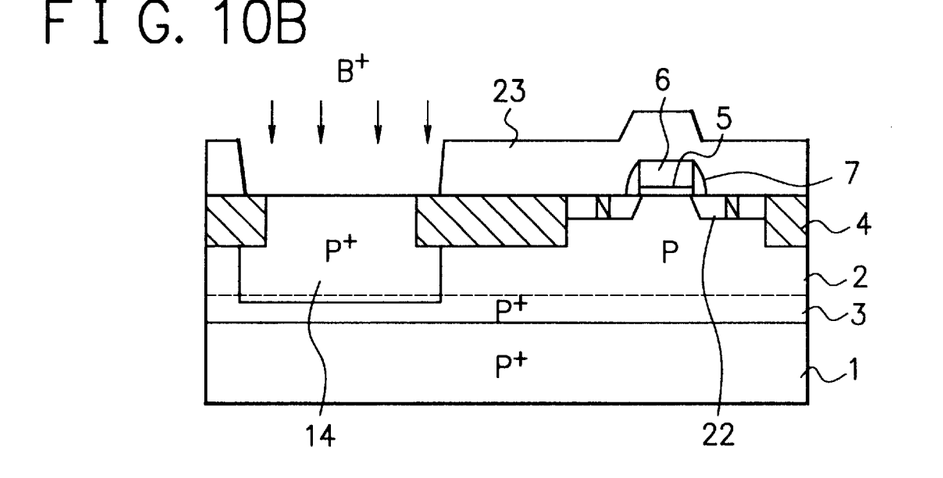

FIGS. 10A to 10C are cross sectional views showing manufacturing process of the semiconductor device of FIG. 9. In the same way as the first embodiment, there is provided with a P-well 2 on P+ type substrate 1 through boron upward diffusion region 3, there is formed a gate oxide film 5, and it causes pattern generation of the gate electrode 6 of the internal transistor to implement due to etching with mask materials as a mask (FIG. 10A). Subsequently, by virtue of the well known technology, there is formed source-drain region of a transistor with LDD construction while utilizing the side wall oxide film 7. There is formed N type LDD region 22 and side wall oxide film 7, before there is formed P+ anode region 14 due to ion implantation of boron with photo resist 23 as the mask (FIG. 10B).

Figure 10C:
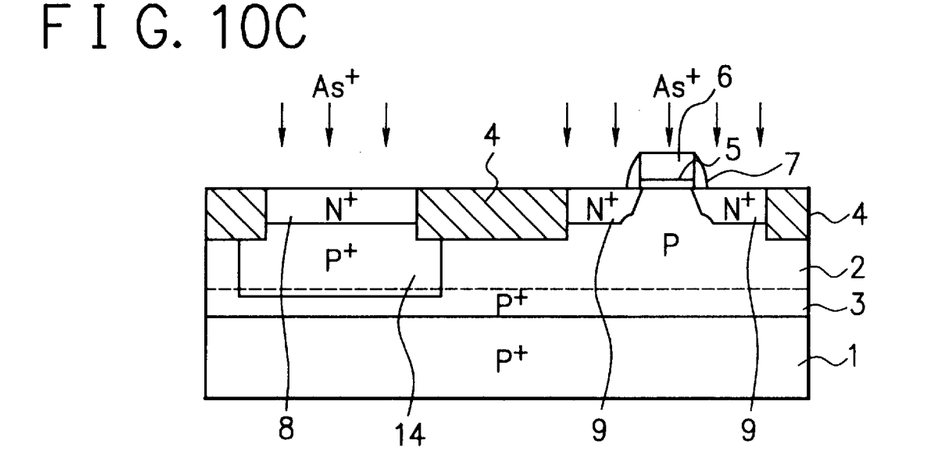

And then there is formed N+ cathode region 8 while implementing ion implantation of arsenic to low breakdown voltage electrostatic protection diode region to form N+ SD region 9 (FIG. 10C). Subsequently, by virtue of the well known technology, there is formed the metal silicide 10 on the surface of silicon, there is formed a ground interlayer insulation film 11, boring hole in contact region, there is formed embedded electrode 12, there is formed wiring electrode 13, and there is implemented pattern generation. As a result thereof, the semiconductor device of construction shown in FIG. 9 is perfected.

Consequently, it is capable of constituting I/O circuit shown in FIGS. 6 to 8 while utilizing the semiconductor device of the second embodiment. It is capable of realizing the same operation as that of the first embodiment, consequently, it is capable of obtaining the same effect as that of the first embodiment.

Next, construction of the second embodiment of the semiconductor device according to the present invention will be explained in more detail referring to FIGS. 9 and 10A to 10C. Referring to FIG. 9, with respect to the semiconductor device, there is provided with a P-well 2 on P+ type substrate 1, and there exits boron upward diffusion region 3 between P+ type substrate 1 and the P-well 2. Impurity density and thickness of respective regions are nearly the same as those of the first embodiment shown in FIG. 4. There is provided with P+ anode region 14 including P type impurity of $1\times10^{18}$ cm$^{-3}$ to $1\times10^{19}$ cm$^{-3}$ so as to come into contact with boron upward diffusion region 3, there is provided with N+ cathode region 8 including arsenic of $1\times10^{20}$ cm$^{-3}$ to $1\times10^{21}$ cm$^{-3}$ on the inside of P+ anode region 14.

There is formed low breakdown voltage electrostatic protection diode D in between N+ cathode region 8 and P+ anode region 14 and its reverse breakdown voltage is of approximately 4V. On the other hand, there is formed an internal transistor (NMOS transistor) T with LDD construction on the P-well 2. Further, thickness of the gate oxide film is of approximately 5 nm. There is provided with metal silicide (Co silicide) 10 for obtaining low resistivity on the surface of N+ cathode region 8, N+ SD region 9 of the MOS transistor, and the gate electrode 6.

Next, the semiconductor device according to the second embodiment will be explained in more detail referring to manufacturing process view of the semiconductor device according to the second embodiment shown in FIGS. 10A to 10C. However, in the same way as the manufacturing process of the semiconductor device according to the first embodiment shown in FIGS. 5A to 5D, it causes silicon to grow on the P+ type substrate 1, before there is formed device isolation oxide film 4 made up of silicon oxide film, so that there is provided the P-well 2 and N-well (not illustrated). Condition of process is the same as that of the first embodiment. Subsequently, recrystallization and redistribution of impurity are implemented by drive-in at 850° C. to 900° C. And then, by virtue of the well known technology, there is formed gate oxide film 5 with 5 nm thick, before there is formed gate electrode made up of silicon of thickness of approximately 200 nm on whole surface. A gate electrode 6 of the MOS transistor is worked by etching with mask materials being subjected to pattern generation as a mask (FIG. 10A). Gate length of the internal transistor is worked to, for example, approximately 0.15 μm.

Subsequently, by virtue of the well known technology, there is formed source-drain region of the transistor with LDD construction while utilizing side wall oxide film 7. For example, an arsenic ion implantation is implemented with the condition that acceleration voltage is 20 KV, and arsenic dose amount is $2\times10^{13}$ cm$^{-2}$ in relation to NMOS transistor, before causing oxide film with approximately 60 nm to grow on all surface to implement etch back. With the result that a side wall oxide film 7 is formed. Subsequently, there is formed P+ anode region 14 while implementing ion implantation of boron with the photo resist 23 as a mask to the region at which the low breakdown voltage electrostatic protection diode is formed (FIG. 10B). The ion implantation of boron is implemented in such a way that acceleration voltage is 300 KV, and boron dose amount is $5\times10^{14}$ cm$^{-2}$ and acceleration voltage is 120 KV, and boron dose amount is $1\times10^{14}$ cm$^{-2}$ to $5\times10^{14}$ cm$^{-2}$ (FIG. 10C). Subsequently, recrystallization and redistribution of impurity are implemented by drive-in at 850° C. to 900° C. Furthermore, there are formed N+ SD region 9 and N+ cathode region 8 while implementing ion implantation of arsenic to a region including NMOS transistor and low breakdown voltage electrostatic protection diode (FIG. 10C). The ion implantation is of acceleration voltage 40 KV, and range of dose amount $1\times10^{15}$ cm$^{-2}$ to $5\times10^{15}$ cm$^{-2}$. Subsequently, there is formed P+ SD region (not illustrated) of the PMOS transistor due to ion implantation of boron.

The ion implantation of boron is implemented in such a way that acceleration voltage is approximately 10 KV, and range of boron dose amount is $1\times10^{15}$ cm$^{-2}$ to $5\times10^{15}$ cm$^{-2}$. Subsequently, by virtue of the well known technology, there is formed metal silicide (Co silicide) 10 with thickness of approximately 20 nm on the surface of silicon, there is formed ground interlayer insulation film 11 with thickness of approximately 0.8 μm, boring a hole in contact region, forming embedded electrode 12 (indicated by W), forming wiring electrode 13 made up of AlCu, and implementing pattern generation, as a result thereof, the semiconductor device having structure shown in FIG. 9 is perfected.

The second embodiment is capable of bringing the same effect as that of the above-described first embodiment. Control of density becomes easy because upward diffusion of boron such as the above-described first embodiment is not utilized, but there is formed anode region 14 with high density due to the ion implantation. Thus it is capable of diminishing manufacturing dispersion of breakdown voltage of the low breakdown voltage electrostatic protection diode.

As described above, in accordance with the present invention, it is capable of setting reverse junction breakdown voltage to low value because diode consisting of PN junction with high density is used as electrostatic protection device. It is capable of protecting internal device in relation to applied surge of reverse direction, since it becomes possible to escape charge to silicon substrate through diode efficiently. Consequently, it is capable of providing the semiconductor device with high reliability, because it is capable of improving electrostatic protection function to the microscopic MOS transistor.

For example, when voltage stress more than 5V is applied to a gate oxide film, while assuming the case where film thickness is of 5 nm of the gate oxide film of the MOS transistor. Characteristic fluctuation becomes remarkable. Applied time thereof becomes long, there might occur breakdown of the gate oxide film. On the assumption of operation with power-supply voltage 2.5 V, a protection device whose condition is OFF-state under application of 2.5 V, while whose condition becomes ON-state at a voltage less than 5V is required. It is difficult to realize such protection device in the conventional protection device. In contrast thereto, it is capable of being realized easily in the construction of the protection diode belonging to the semiconductor device according to the present invention. Furthermore, for example, it becomes possible to form diode which begins reverse breakdown at4V, when it causes anode region and cathode region to be density set in the embodiment. As a result, it becomes possible to protect a gate oxide film of device at later part from the surge.

Furthermore, it is capable of escaping charge to GND level efficiently, because substrate with low resistivity is used, thus it is capable of obtaining effect that it causes charge amount applied to device at later part to reduce. Thus it is capable of providing the semiconductor device which can contribute to improvement of electrostatic protection function.

Furthermore, it is capable of diminishing area of protection device itself, because it causes function of protection device to improve in comparison with the conventional semiconductor device. Moreover, in the output circuit, not only it is capable of diminishing size of transistor, because it is unnecessary to cause large parasitic capacitance to possess to an output transistor, but also it is capable of realizing high speed I/O easily due to lowering of capacitance of the output pin. While in the input circuit it is also possible to realize electrostatic protection function only using diode, without implementation of taking a gate control type diode and a diode together as explained in the embodiment. Consequently, it is capable of providing semiconductor device which enhances integration degree and which enhances property.

While preferred embodiments of the invention have been described using specific terms, such description is for illustrative purpose only, and it is to be understood that changes and variations may be made without departing from the spirit or scope of the following claims.

What is claimed is:

1. A semiconductor device comprising:
   a MOS transistor formed on a first conductivity type semiconductor layer, said layer being formed on a high density semiconductor substrate, which is of said first conductivity type, through an impurity upward diffusion region by an epitaxial growth; and
   a diode, which is an electrostatic protection device, connected between either a gate electrode of said MOS transistor, or a drain region of said MOS transistor, and said high density semiconductor substrate, wherein an impurity density of an anode side at a junction of said diode is higher than an impurity density of an anode side at a drain junction of said MOS transistor, but lower than an impurity density of the high density semiconductor layer.

2. A semiconductor device as claimed in claim 1, wherein a reverse breakdown voltage of said diode is lower than a drain junction breakdown voltage of said MOS transistor.

3. A semiconductor device as claimed in claim 1, wherein a reverse breakdown voltage of said diode is lower than a breakdown voltage of a gate oxide film of said MOS transistor.

4. A semiconductor device as claimed in claim 2, wherein said junction of said diode is closer to said high density semiconductor substrate than said drain junction of said MOS transistor.

5. A semiconductor device as claimed in claim 1, wherein said junction of said diode is a junction at said impurity upward diffusion region.

* * * * *